(12) United States Patent
Otremba

(10) Patent No.: US 7,391,121 B2
(45) Date of Patent: Jun. 24, 2008

(54) SEMICONDUCTOR DEVICE WITH A NUMBER OF BONDING LEADS AND METHOD FOR PRODUCING THE SAME

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/351,988

(22) Filed: Feb. 10, 2006

(65) Prior Publication Data

US 2006/0186554 A1   Aug. 24, 2006

(30) Foreign Application Priority Data

Feb. 10, 2005   (DE) ........................ 10 2005 006 333

(51) Int. Cl.
H01L 23/48 (2006.01)
H01L 23/52 (2006.01)
H01L 23/40 (2006.01)

(52) U.S. Cl. ..................................... 257/784
(58) Field of Classification Search ................. 257/784; 228/180.21
See application file for complete search history.

(56) References Cited

U.S. PATENT DOCUMENTS 4,875,618 A * 10/1989 Hasegawa et al. ........ 228/180.5
5,186,381 A * 2/1993 Kim ........................ 228/123.1
5,736,074 A * 4/1998 Hayes et al. ................... 264/6
7,021,521 B2 * 4/2006 Sakurai et al. ........... 228/180.5

FOREIGN PATENT DOCUMENTS

| DE | 103 24 069 A2 | 12/2004 |
| EP | 0 265 927 A2 | 10/1987 |
| JP | 63244633 A | 10/1988 |
| JP | 01048438 A | 2/1989 |
| JP | 06005647 A | 1/1994 |
| JP | 10125710 A | 5/1998 |
| JP | 2000-82721 A | 3/2000 |
| JP | 2000-323514 A | 11/2000 |

OTHER PUBLICATIONS

Machine-Generated English Translation of DE10324069 (Xaver Schlogel reference already of record), the original German version having been published Dec. 23, 2004.

* cited by examiner

Primary Examiner—David A Zarneke
Assistant Examiner—Jenny L Wagner
(74) Attorney, Agent, or Firm—Banner & Witcoff, Ltd.

(57) ABSTRACT

A semiconductor device (7) has a number of bonding leads (1, 2, 3) with more than one individual bonding lead (1) being arranged on an individual contact area (4) of a semiconductor chip (5) or a wiring component (6) of the semiconductor device (7). The bonding leads (1, 2 and 3) of a stack (8) form ohmic transitions (12, 13) in their boundary layers. For this purpose, the stacked contact elements (9, 10) have different materials with a different material composition.

24 Claims, 4 Drawing Sheets

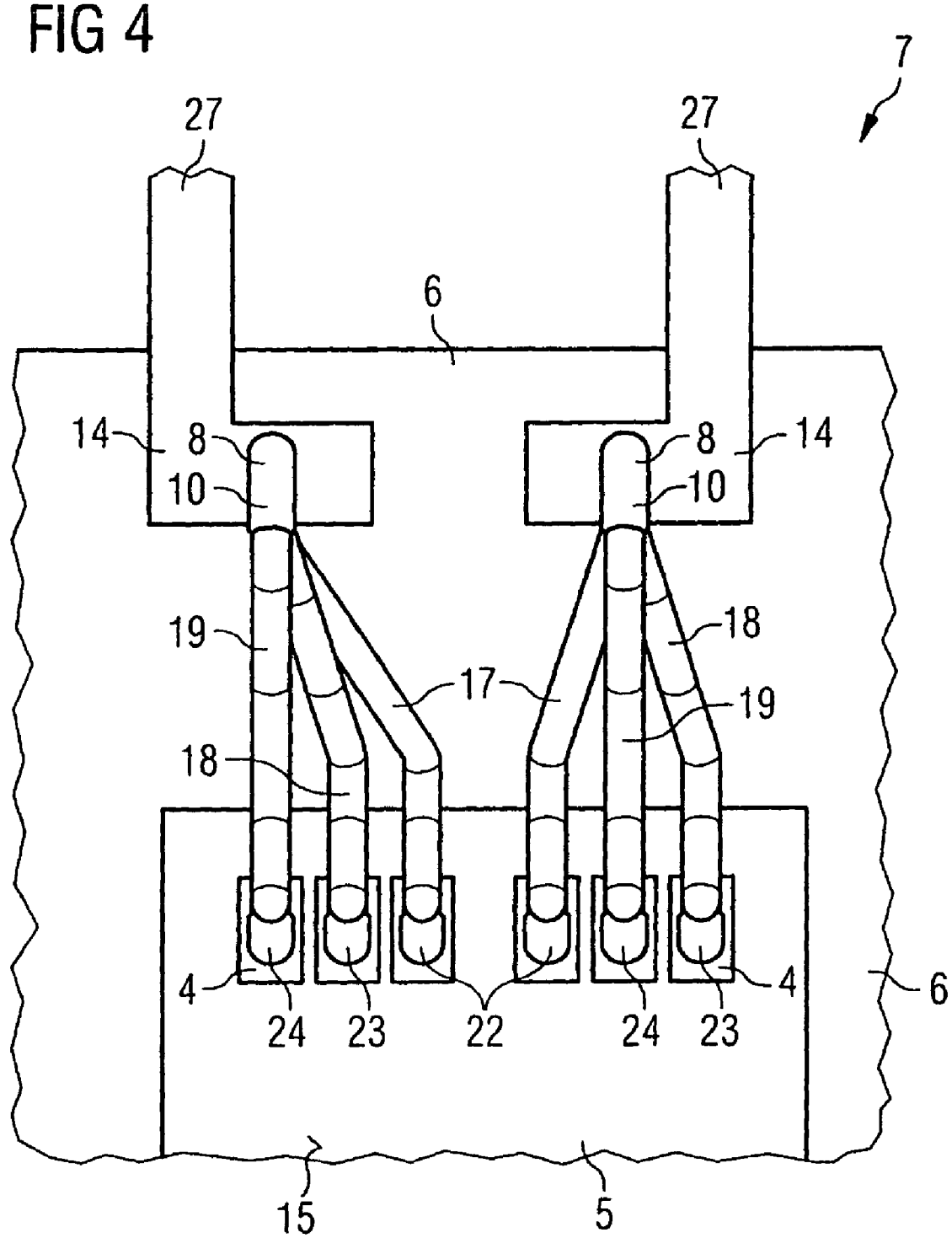

SEMICONDUCTOR DEVICE WITH A NUMBER OF BONDING LEADS AND METHOD FOR PRODUCING THE SAME

PRIORITY

This application claims priority from German Patent Application No. DE 10 2005 006 333.0, which was filed on Feb. 10, 2005, and is incorporated herein by reference in its entirety.

TECHNICAL FIELD

The invention relates to a semiconductor device with a number of bonding leads and to a method for producing the same. In this case, the semiconductor device has more than one individual bonding lead on an individual contact area of a semiconductor chip or a wiring component of the semiconductor device. In this context, a wiring component is understood as meaning a wiring substrate on which the semiconductor chip can be arranged or a flat conductor construction with a chip island on which the semiconductor chip can be mounted or some other circuit component which is required for the connecting of contact areas on the active upper side of the semiconductor chip to corresponding external contacts of the semiconductor device.

BACKGROUND

Bonding leads are understood in this context as meaning any kind of contacting of the contact areas of the semiconductor chip or the contact terminal areas of a wiring component serving for the onward routing of electrical supply lines and/or electrical signal lines. A wiring component of this type may also have bonding leads, which are used in many power semiconductor devices to transport electrical currents by means of bonding wires from an active upper side of a semiconductor chip to corresponding contact terminals or to corresponding contact terminal areas of a wiring component. In this case, the overall cross section of bonding wires of this type restricts the maximum current handling capability of the device as a whole.

In the document JP 2000 082721-A, copper links are used in a MOSFET power semiconductor device in place of aluminum bonding wires, with the effect of increasing the current handling capacity. However, copper links of this type have the disadvantage that they have to be specifically designed and adapted for each contact area of a semiconductor chip. Furthermore, process control is more expensive than in the case of simply increasing the number of bonding leads or bonding wires in a semiconductor device.

The document EP-A-0 265 927 discloses arrangements which optionally have a number of bonding wires arranged one on top of the other on a contact area of an active upper side of a semiconductor chip or on corresponding contact terminal areas of a wiring component. The bonding wires in this known document are made of gold. However, gold bonding wires with a diameter of between 20 µm and 50 µm are not recommendable for power semiconductor components in comparison with aluminum bonding wires of 50 µm to 600 µm. On the one hand, to achieve the same cross section, a large number of gold bonding wires would be required for wiring of the semiconductor chip, which quickly brings this technology to its limits, and on the other hand solid thick gold bonding wires of around the same size as aluminum wires are a cost factor which would disadvantageously escalate the costs for the production of power semiconductor devices of this type.

The document DE 1 032 40 69 A1 discloses a circuit arrangement with a method for the conductive connection of contact areas on semiconductor chips. Aluminum bonding wires are also used in the case of this publication for power semiconductor devices, the bonding leads being stacked in order to reduce the required chip contact areas, which for aluminum wires with a diameter of 600 µm already need a considerable amount of space on a semiconductor chip in order to electrically connect the semiconductor chip to a wiring component even in the stacked state. While the bonding leads are stacked one on top of the other on the semiconductor chip, since the available area of the semiconductor chip is relatively small in comparison with the available area of a wiring component, the bonding wires on the contact terminal area of a wiring component may well be arranged next to one another, in that the bonding wires are correspondingly splayed out from the common contact area and attached on a larger area of the contact terminal area of the wiring component.

Nevertheless, it has been found that bonding wire stacks of this type, whether for power semiconductor devices with stacked aluminum bonding wires or for signal-processing semiconductor devices with thin stacked gold bonding wires, represent a risk to the formation of a low contact transition resistance, especially since bonding of aluminum bonding wire on aluminum bonding wire or of gold bonding wire on gold bonding wire or of copper bonding wire on copper bonding wire is used in the case of the previously known stacking technologies. One disadvantage that has been observed with these stacked bonding leads is that the boundary layers between the contact elements sometimes become brittle on account of the susceptibility of copper and/or aluminum bonding wires to oxidize. Another disadvantage is that, during bonding, the relatively high melting temperatures of these metals must be reached in a locally restricted area, which can likewise have disadvantageous effects on the properties of the stacked bonding leads and on the monocrystalline semiconductor material lying there under or the material of the wiring component.

SUMMARY

The object of the invention is to reduce adverse effects on a semiconductor chip material or material of a wiring component, such as overheating, embrittlement or microcrack formation, during the bonding of a number of bonding leads on an individual contact area or contact terminal area while stacking contact elements on the contact area or contact terminal area and to provide a semiconductor device which has stacked bonding leads with reduced contact transition resistances.

This object can be achieved by a semiconductor device comprising a number of bonding leads, wherein more than one individual bonding lead are arranged on an individual contact area of a semiconductor chip or a wiring component of the semiconductor device, the bonding leads form a stack of at least two contact elements arranged one on top of the other, the material of the lower, first contact element comprises an ohmic contact transition with the material of the contact area, the material of the stacked, second contact element comprises an ohmic contact transition with the material of the first contact element arranged there under, and the materials of the first and second contact elements that are stacked one on top of the other and bonded comprise different material compositions.

The different material compositions can be metal alloys, the base metal of which is identical and the alloying elements of which differ in such a way that one of the contact elements is harder than the other contact element. The different material compositions can also be aluminum alloys, the harder contact element comprising silicon as the alloying element. The different metal compositions can further be copper alloys, the harder contact element comprising Fe, Ni, P, Zn, Sn and/or Co as the alloying element. The different metal compositions may comprise different base metals, which differ in their degrees of hardness in such a way that one of the contact elements is harder than the other contact element. One of the contact elements may comprise aluminum, silver or gold or alloys of the same, and the harder contact element may comprise copper, nickel or alloys of the same. The contact elements in the stack can be of such a hardness that the hardness of the stacked contact elements increases from the contact area toward the upper contact element. The contact elements in the stack can also be of such a hardness that the hardness of the stacked contact elements increases from the upper contact element toward the contact area.

The object can also be achieved by a method for producing a semiconductor device with a number of bonding leads, more than one individual bonding lead being arranged on an individual contact area of a semiconductor chip, and the method comprising the following method steps: producing a semiconductor chip or a wiring component of the semiconductor device with at least one individual contact area for a number of bonding leads, which are stacked on the contact area; providing at least two contact elements to be arranged one on top of the other, which comprise different material compositions; staggered bonding of the contact elements, the material of the lowermost, first contact element forming an ohmic contact transition with the contact area during the bonding on the contact area, and the stacked, second contact element forming an ohmic contact during the bonding to the first contact element arranged there under.

The contact elements can be stacked on the contact area by means of wedge bonding. Firstly, the contact element, which comprises a harder material than a contact element to be stacked, can be bonded onto the contact area. Also, firstly, the contact element, which comprises a softer material than a contact element to be stacked, can be bonded onto the contact area. Also, firstly, a contact element, which comprises copper or a copper alloy, can be bonded onto the contact area and, subsequently, a contact element, which comprises aluminum or an aluminum alloy, can be bonded onto the already bonded contact element. Also, firstly, a contact element, which comprises aluminum, copper, nickel or alloys of the same, can be bonded onto a contact area which has a coating of Al, Pt, Pd or Au, and, subsequently, a contact element, which comprises gold, is bonded onto the already bonded contact element.

According to the invention, a semiconductor device with a number of bonding leads is provided, more than one individual bonding lead being arranged on an individual contact area of a semiconductor chip or a wiring component of the semiconductor device. The bonding leads in this case form a stack of at least two contact elements arranged one on top of the other. The material of the lower, first contact element has an ohmic contact transition with the material of the contact area. The material of the stacked second contact element has an ohmic contact transition with the material of the first contact element lying there under. In this case, the materials of the first and second contact elements that are stacked one on top of the other and bonded have different material compositions.

This semiconductor device has the advantage that, on account of the different material compositions of the bonded first contact elements, the bonding leads with stacked contact elements in the semiconductor device reduce the risk of overheating during bonding, because it is not necessary to bond aluminum onto aluminum or copper onto copper or gold onto gold. Rather, the materials can be made to match one another in their composition, so that low-melting alloys or metal phases occur in the boundary areas during bonding, and consequently reduce the risk of overheating, and provide a perfect ohmic contact between the bonding wires bonded one on top of the other.

In a preferred embodiment of the invention, different metal compositions are achieved by different metal alloys, the base metal of which is identical and the alloying elements of which differ in such a way that one of the contact elements is harder than the other of the contact elements. The harder material of one of the contact elements has the effect of improving the contact robustness in the semiconductor device, since a greater proportion of the bonding energy applied is introduced or used for forming the contact between the bonding wires and less for the plastic deformation of the transition between the bonding wires and the contact area. Consequently, the different bonding wire materials are used in an advantageous way to optimize the contact robustness of bonding wires arranged one on top of the other. This contact robustness is also significant for reliably introducing or embedding the semiconductor chip and the stacked contact element into a plastic package molding compound. This produces semiconductor devices with stacked contact elements of improved reliability.

In a further embodiment of the invention, the different material compositions have aluminum alloys, the harder contact element containing silicon as the alloying element. This has the advantage that, for increasing the reliability of the semiconductor devices and by use of aluminum wires with differing hardness, an improvement of the reliability that is decisive for power semiconductor devices can be achieved.

In a further advantageous embodiment of the invention, the different metal compositions are achieved by means of copper alloys, the harder contact element of copper having iron, phosphorus, zinc, nickel, cobalt or tin as alloying elements. For copper alloys, it is known that alloying elements of this type permit improved wear resistance of the copper alloy. Consequently, a greater dimensional stability occurs during bonding for the harder contact elements of a copper alloy with silicon, so that the material of the contact element of a soft, ductile copper alloy comes to lie around the harder copper wire, and consequently forms an increased contact transition area and thereby a reduced contact transition resistance.

In a further embodiment of the invention, the different metal compositions have different base metals, which differ in their degrees of hardness in such a way that one of the contact elements is harder than the other contact element. In this case, the softer contact element may preferably comprise aluminum, silver or gold or alloys of the same and the harder contact element may be formed from copper, nickel or alloys of the same. The advantages that can be achieved thereby for the semiconductor device, and in particular for the stack of contact elements, are equivalent to those in the case of the previously cited examples. One particular advantage, however, lies in metal combinations of the base metals which form eutectic melt phases with a low melting point with one another, so that the bonding process is protected against instances of overheating.

During the stacking of the bonding wires of differing hardness, there are two possibilities, each of the possibilities having different advantages for the semiconductor device. On the one hand, the contact elements in the stack may be of such a hardness that the hardness of the stacked contact elements increases from the contact area toward the upper contact element. In this case, the lower, softer and consequently more ductile contact element serves the purpose of distributing the introduced bonding energy over a larger region of the contact area of a semiconductor chip or the contact terminal area of a wiring component, and consequently of correspondingly sparing the material of the semiconductor chip or the material of the wiring component. This allows risks of microcrack formation in the region of the contact areas or contact terminal areas provided with bonding leads to be minimized.

Alternatively, there is the possibility of the contact elements in a stack being of such a hardness that the hardness of the stacked contact elements increases from the upper contact element toward the contact area. Consequently, the harder contact element lies directly on the contact area or contact terminal area and a greater proportion of the bonding energy is introduced into the boundary surface between the bonding wires when the stacked contact element is applied to the already bonded lower contact element. In this case, a preferred material combination of the power semiconductor devices is that the lower bonding wire consists of copper or a copper alloy and the upper bonding wire is made of an aluminum or aluminum alloy.

The method for producing a semiconductor device with a number of bonding leads, more than one individual bonding lead being arranged on an individual contact area of a semiconductor chip or a wiring component, has the following method steps.

Firstly, a semiconductor chip or a wiring component of the semiconductor device is produced with at least one individual contact area or contact terminal area for a number of bonding leads, which are stacked on the contact area or contact terminal area. Furthermore, at least two contact elements to be arranged one on top of the other, which have different material compositions, are provided. With these different contact elements, staggered bonding of the contact elements then takes place, the material of the lowermost, first contact element, which is introduced during the bonding on the contact area or the contact terminal area, forming an ohmic contact transition with the contact area or contact terminal area. During the bonding of the second contact element to be stacked, its material forms an ohmic contact transition with the first contact element arranged there under.

In an advantageous way, the different material compositions of the two bonding wires to be bonded one on top of the other ensure here that a higher proportion of the bonding energy is introduced into the boundary layer between the two bonding wires, in particular whenever the lower contact element comprises a harder material than the upper contact element, so that less energy goes into the deformation of the lower contact element.

For the bonding itself, preferably so-called "wedge bonding" is used, in which a relatively high bonding interface can be realized between the bonding wires in an advantageous way. Furthermore, "wedge bonding" has the advantage that a package for the semiconductor device can be made in a relatively low, and consequently space-saving configuration.

In an alternative method, firstly the contact element with the softer material is bonded onto the contact area. This variant of the method has the advantage that, during the bonding of a harder contact element as the upper bonding lead, the contact area or the contact terminal area of the material arranged there under of the semiconductor chip or the material of the wiring component is subjected to less loading, since a large part of the bonding energy goes into deformation work of the lower bonding wire, which consequently serves as a mechanical buffer.

Alternatively, firstly a contact element which comprises copper or a copper alloy may be bonded onto the contact area, and then subsequently a contact element which comprises aluminum or an aluminum alloy may be bonded onto the already bonded contact element. In this case, the harder copper alloy forms the lower bonding lead, while the softer aluminum alloy is then applied to the contact element made of copper or a copper alloy. In this case, it can be assumed that the harder, lower contact element does not deform any more and the entire bonding energy goes into the contact-forming with respect to the copper bonding wire, whereby an improved and lower contact transition resistance can be achieved between the two stacked contact elements.

In a further method, firstly an aluminum bonding wire is applied to a copper area, which may have a bonding coating. As a further bonding wire, a gold bonding wire may then be applied to the aluminum bonding wire, so that the formation of eutectic melts can also be used for the second contact transition between the two contact elements, in order to ensure minimal heating of the surroundings during bonding. However, the smaller diameter of the gold bonding wire is better suited for ensuring signal transmissions than just transporting currents. However, the aluminum wire can take over the transporting of current, the second end of the aluminum wire being bonded onto a separate contact terminal area.

To sum up, it can be stated that, with the present invention, semiconductor devices with circuits can be realized, aluminum wedge-bonding wires of differing hardness having the effect of improving and optimizing the stacked bonding leads, at least when the harder material is provided for the lower bonding wire. Instead of a harder aluminum bonding wire, a copper bonding wire may also be bonded as the lower bonding wire on the contact area of a semiconductor chip or a semiconductor chip carrier, and after that an aluminum bonding wire may be contacted on the copper bonding wire.

Further possibilities are firstly to attach an aluminum bonding wire on the contact area or the contact terminal area of the semiconductor chip or a semiconductor chip carrier, such as a wiring component of a semiconductor device, and after that contact a gold bonding wire on the aluminum bonding wire. With these examples, softer materials are in each case contacted on harder materials during the bonding processes, thereby optimizing the use of the bonding energy for the contact area between the bonding wires.

On the other hand, it is also conceivable to turn this arrangement around and contact the hard bonding wires on softer bonding wires. This allows the semiconductor chip structures lying underneath the bonding wire or the structures of a wiring component to be spared during the bonding wire process, since the bonding wire lying at the bottom absorbs the bonding energy as a buffer element and does not pass it on to the brittle semiconductor chip or to the material of the wiring component.

The variation of the bonding wire properties can also be realized by modifying the alloying constituents. For example, in the case of bonding wires, the hardness of aluminum can be significantly increased by the addition of 1% by weight of silicon. The form of the contact elements is relatively freely selectable here. For instance, gold ball contacts may also be realized on an aluminum wedge contact. A gold ball contact of this type is produced here by forming a silicon melting pill of a gold bonding wire on the tip of a bonding stylus.

BRIEF DESCRIPTION OF THE DRAWINGS

The invention is now explained in more detail on the basis of the accompanying figures.

FIG. 4 shows a schematic plan view of a semiconductor device of a third embodiment of the invention.

DETAILED DESCRIPTION

Figure 1:
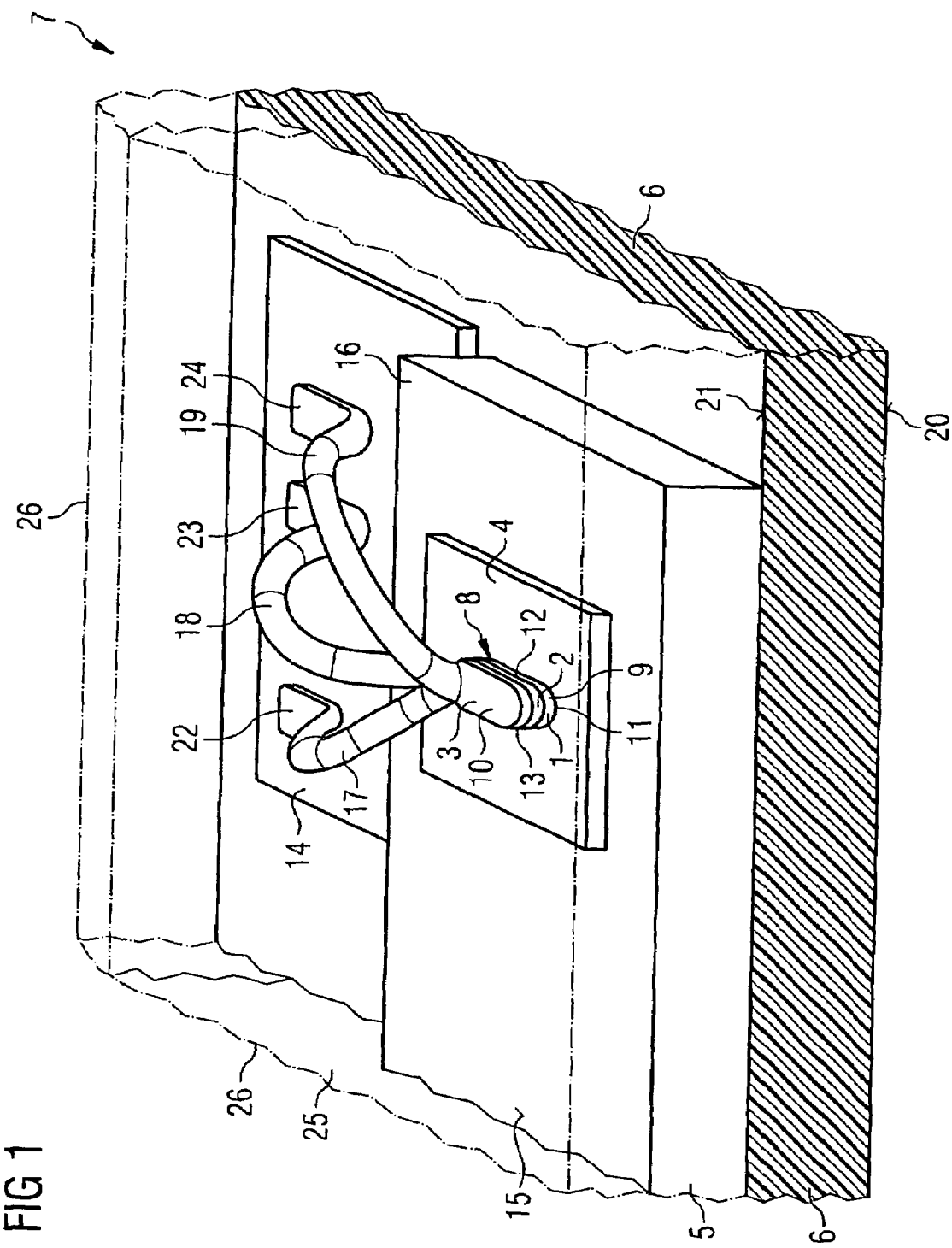
FIG. 1 shows a cut-open basic perspective diagram of a semiconductor device of a first embodiment of the invention.

FIG. 1 shows a cut-open basic perspective diagram of a semiconductor device 7 of a first embodiment of the invention. The semiconductor device 7 has a semiconductor chip 5, which has in a corner region 16 on its active upper side 15 a contact area 4, which serves for supplying current to the semiconductor chip 5. In order to feed current of adequate intensity via corresponding bonding wires 17, 18 and 19 to the semiconductor chip 5 over the contact area 4, the bonding wires 17, 18 and 19 are stacked with their bonding leads 1, 2 and 3 one on top of the other on the relatively small contact area 4.

It can be ensured by the stacking that the semiconductor chip is applied with current of adequate intensity without the bonding wires 17, 18 and 19 being overloaded. The bonding wires 17, 18 and 19 are for their part supplied with current from outside through a wiring component 6, which has a contact terminal area 14 on its upper side 21. The external terminals, which are arranged on the underside 20 of the wiring component 6, are not visible in this representation of FIG. 1.

The contact terminal area 14 is significantly larger in the extent of its surface area than the contact area 4 on the semiconductor chip 5, especially since the active upper side 15 of the semiconductor chip 5 is limited, while the available area on the upper side 21 of the wiring component 6 can be enlarged according to any desired requirements. This larger contact terminal area 14 makes it possible for the three bonding leads 1, 2 and 3, which on the contact area 4 are still stacked one on top of the other, to be then drawn apart and splayed and to go over into individual contact terminals 22, 23, 24 on the contact terminal area 14 on the upper side 21 of the wiring component 6.

The bonding leads 1, 2 and 3 for their part comprise different materials. In this embodiment of the invention, the material of the bonding lead 1 is harder than the material of the bonding leads 2 and 3 arranged there above. This ensures that the applied bonding energy during the bonding is increasingly introduced for producing a low-impedance contact transition resistance at the contact transitions 12 and 13, and consequently a robust bonded connection. In addition, the basic diagram shows that the stack 8 of bonding leads 1, 2 and 3 is produced by the wedge-bonding method. This wedge-bonding method ensures that relatively flat bonding loops are created from the contact area 4 on the semiconductor chip 5 to the contact terminal area 14 on the wiring component 6.

Arranged on the upper side 21 of the wiring component 6 is a plastic package molding compound 25, the contour of which is represented by dashed lines 26. The semiconductor chip 5 with the bonding leads 1, 2 and 3 and the bonding wires 17, 18 and 19 are embedded in this plastic package molding compound. Furthermore, the plastic package molding compound 25 covers the upper side 21 of the wiring component 6 and the contact terminal area 14 of the wiring component 6.

Figure 2:
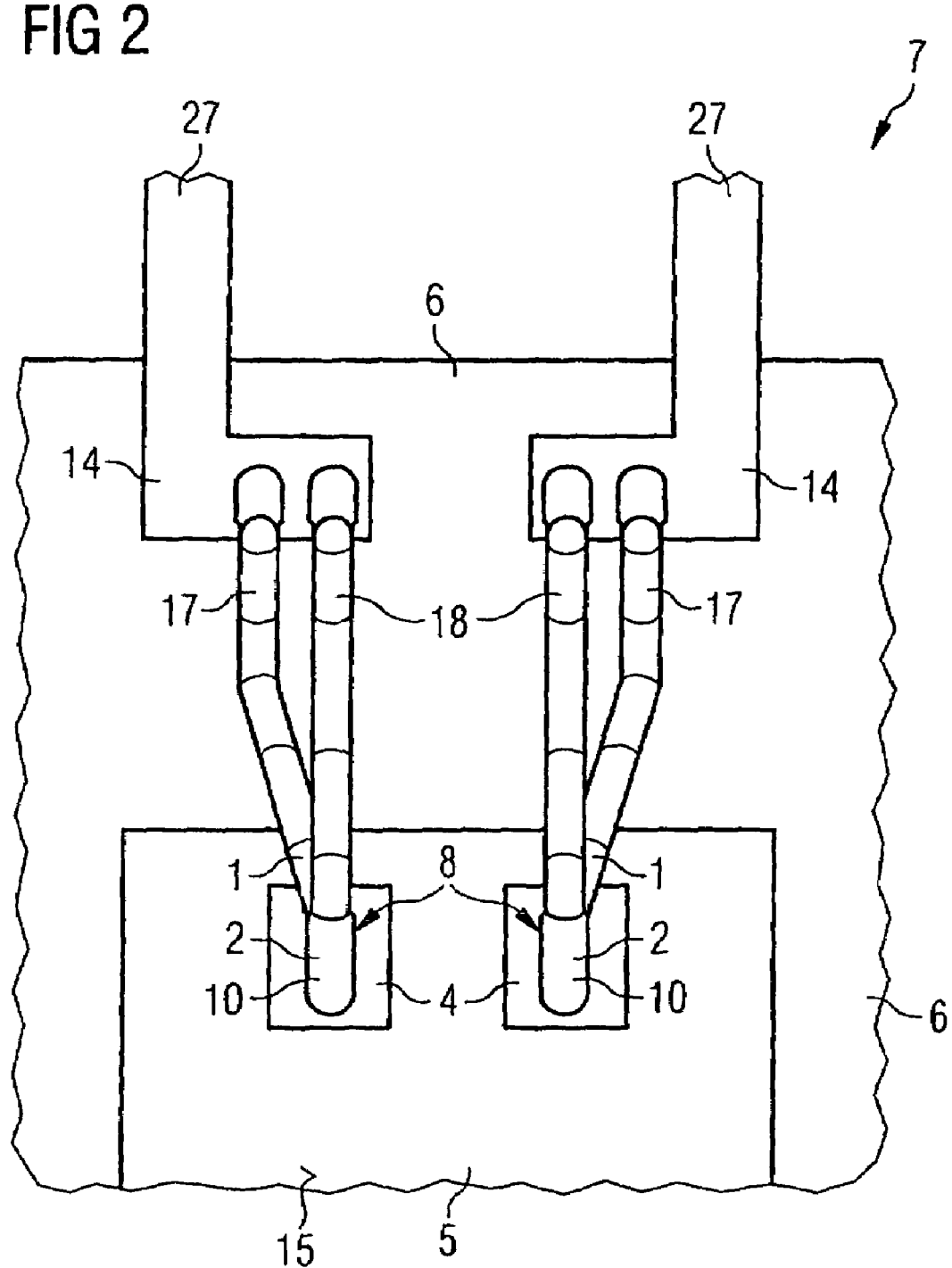
FIG. 2 shows a schematic plan view of a semiconductor device of a second embodiment of the invention.

FIG. 2 shows a schematic plan view of a semiconductor device 7 of a second embodiment of the invention with two bonding leads 1 and 2. In the case of this plan view, the plastic package molding compound has been omitted, in order to show the wiring by the bonding wires 17 and 18. Furthermore, this plan view of the semiconductor device 7 shows two laterally led-out external terminals 27, which are formed as flat conductors and respectively go over within the semiconductor device 7 into contact terminal areas 14, on which the bonding wires 17 and 18 are bonded. Arranged on the active upper side 15 of the semiconductor chip 5 are two contact areas 4, to which the bonding wires 17 and 18 lead in pairs and at which they form bonding leads 1 and 2 stacked one on top of the other, in order to minimize the surface area required for contact terminals 4 on the upper side 15 of the semiconductor chip 5.

The bonding wire 17 goes over into a lower bonding lead 1 and comprises copper or a copper alloy as the bonding wire material. The bonding wire 18 is stacked on the bonding lead 1 in the region of the contact area 4 and comprises an aluminum alloy as the bonding wire material. In this embodiment of the invention, this alloy is used as a bonding wire 18 with a diameter of 60 µm, in order to allow a correspondingly large cross section for currents of high intensity to flow from the external terminals 27 over the contact area 14 to the bonding wires 17 and 18 up to the contact area 4. From the contact area 4, the semiconductor elements on the active upper side 15 of the semiconductor device 7 are supplied with this current.

Figure 3:
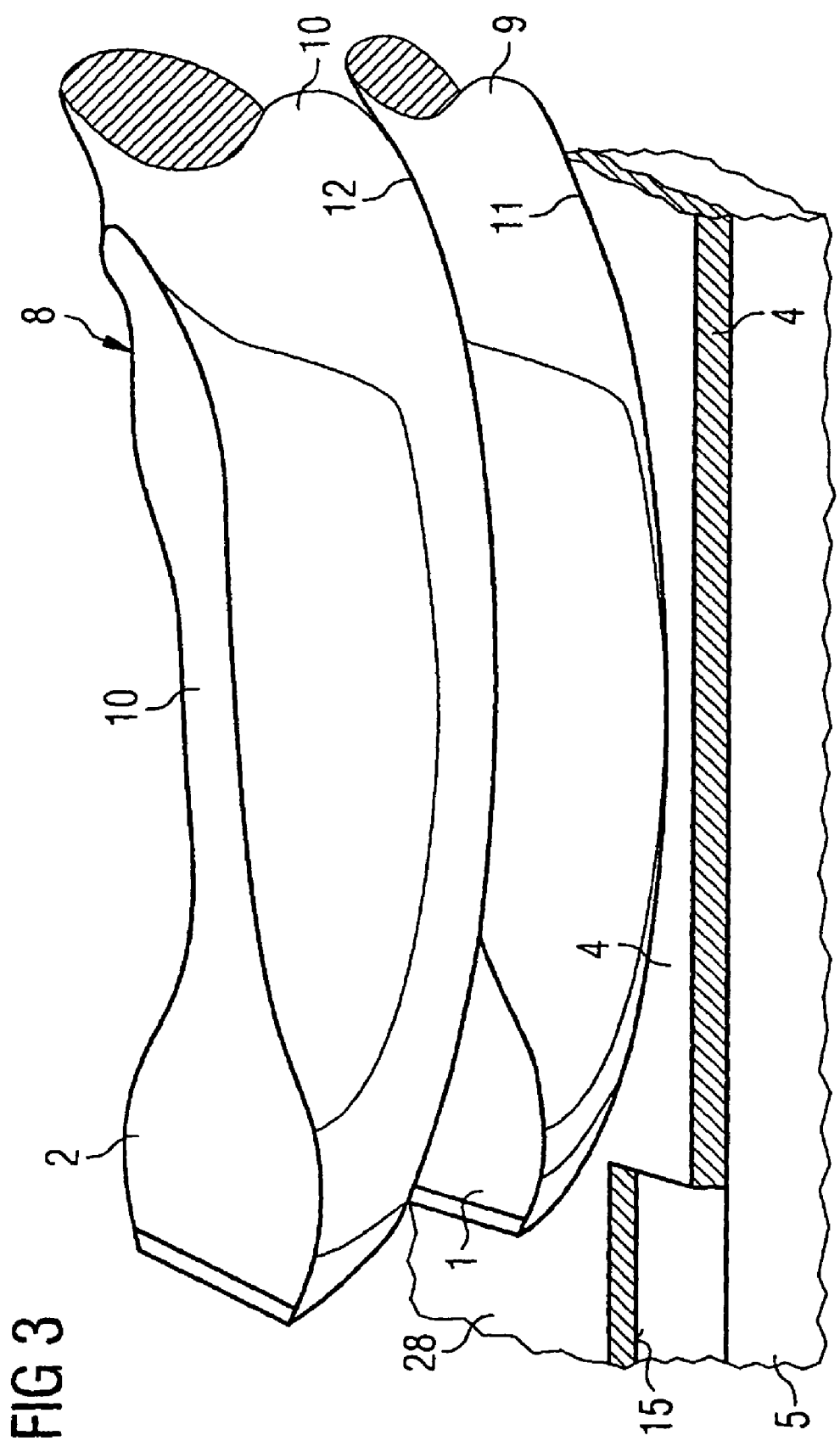
FIG. 3 shows a basic diagram of a photo of stacked bonding leads on an individual contact area.

FIG. 3 shows a basic diagram of a photo of stacked bonding leads 1 and 2 on an individual contact area 4. This contact area 4 is arranged on a semiconductor chip 5 and goes over into an interconnect 28, which leads to corresponding semiconductor elements on the active upper side 15 of the semiconductor chip 5. The stack 8 of bonding leads 1 and 2 has a first, lower contact element 9, the material of which is a copper alloy, while the second bonding leads 2 has a contact element 10, which consists of an aluminum alloy.

In this embodiment of the invention, the traces of the bonding stylus produced during the bonding of the contact elements 9 and 10 can be clearly seen. In this case, an ohmic contact transition 11 forms between the lower contact element 9 and the contact area 4 of the semiconductor chip 5. In a second bonding process, a contact transition 12 is produced between the second, upper contact element 10 and the first, lower contact element 9. On account of the greater hardness of the copper alloy of the lower contact element 9, the bonding energy applied during the second bonding step is introduced into the contact-forming of the contact transition 12, so that an improved ohmic contact transition is ensured for this boundary layer between the first contact element 9 and the second contact element 10.

FIG. 4 shows a schematic plan view of a semiconductor device 7 of a third embodiment of the invention. Components with the same functions as in the previous figures are identified by the same designations and not separately explained. The third embodiment differs from the second embodiment according to FIG. 2 in that the stacks 8 of bonding leads are arranged on the contact terminal areas 14 of the interconnect lugs to the external contacts 27, while a number of individual bonding leads 22, 23 and 24 are arranged on the contact areas 4 of the semiconductor chip 5.

LIST OF DESIGNATIONS 1 bonding lead
2 bonding lead
3 bonding lead
4 contact area
5 semiconductor chip
6 wiring component 7 semiconductor device
8 stack of bonding leads
9 first, lower contact element
10 second, upper contact element
11 contact transition
12 contact transition
13 contact transition
14 contact terminal area
15 active upper side
16 corner region
17 bonding wire
18 bonding wire
19 bonding wire
20 underside of the semiconductor device
21 upper side of the wiring component
22 contact terminal
23 contact terminal
24 contact terminal
25 plastic package molding compound
26 dashed line
27 external terminals
28 interconnect

What is claimed is:

1. A semiconductor device, comprising:
a plurality of individual bonding leads each having a first end disposed on an individual contact area of a semiconductor chip and a second opposite end disposed on a wiring component of the semiconductor device,
wherein the bonding leads form a stack of at least a first contact element and a second contact element arranged on top of the first contact element,
a material of the first contact element comprises an ohmic contact transition with a material of the contact area,
a material of the second contact element comprises an ohmic contact transition with the material of the first contact element arranged there under, and
the materials of the first and second contact elements comprise different material compositions.

2. A semiconductor device according to claim 1, wherein the different material compositions are metal alloys, a base metal of which is identical and alloying elements of which differ in such a way that one of the contact elements is harder than the other contact element.

3. A semiconductor device according to claim 1, wherein the different material compositions are aluminum alloys, a harder one of the contact elements comprising silicon as an alloying element.

4. A semiconductor device comprising a number of bonding leads, wherein
more than one individual bonding lead are arranged on an individual contact area of a semiconductor chip or a wiring component of the semiconductor device,
the bonding leads form a stack of at least first and second contact elements arranged one on top of the other,
the material of the lower, first contact element comprises an ohmic contact transition with the material of the contact area,
the material of the stacked, second contact element comprises an ohmic contact transition with the material of the first contact element arranged there under,
the materials of the first and second contact elements that are stacked one on top of the other and bonded comprise different material compositions, and
wherein the different metal compositions are copper alloys, a harder one of the contact elements comprising at least one of Fe, Ni, P, Zn, Sn and Co as an alloying element.

5. A semiconductor device according to claim 1, wherein the different metal compositions comprise different base metals, which differ in their degrees of hardness in such a way that one of the contact elements is harder than the other contact element.

6. A semiconductor device according to claim 1, wherein one of the contact elements comprises aluminum, silver or gold or alloys of the same, and the harder one of the contact elements comprises copper, nickel or alloys of the same.

7. A semiconductor device according to claim 1, wherein the contact elements in the stack are of such a hardness that the hardness of the contact elements increases from the contact area toward the second contact element.

8. A semiconductor device according to claim 1, wherein the contact elements in the stack are of such a hardness that the hardness of the contact elements increases from the second contact element toward the contact area.

9. A semiconductor device, comprising:
a contact area of a semiconductor chip,
a wiring component of the semiconductor device, and
a plurality of bonding leads each electrically connecting the contact area and the wiring component,
wherein
the plurality of bonding leads form a stack of at least a first contact element and a second contact element arranged on top of the first contact element,
a material of the first contact element comprises an ohmic contact transition with an underlying material,
a material of the second contact element comprises an ohmic contact transition with the material of the first contact element arranged there under, and
the materials of the first and second contact elements comprise different material compositions.

10. A semiconductor device according to claim 9, wherein the different material compositions are metal alloys, a base metal of which is identical and alloying elements of which differ such that one of the contact elements is harder than the other contact element.

11. A semiconductor device according to claim 9, wherein the different material compositions are aluminum alloys, a harder one of the contact elements comprising silicon as an alloying element.

12. A semiconductor device according to claim 9, wherein the different metal compositions are copper alloys, a harder one of the contact elements comprising Fe, Ni, P, Zn, Sn and/or Co as an alloying element.

13. A semiconductor device according to claim 9, wherein the different metal compositions comprise different base metals, which differ in their degrees of hardness in such a way that one of the contact elements is harder than the other contact element.

14. A semiconductor device according to claim 9, wherein one of the contact elements comprises aluminum, silver or gold or alloys of the same, and a harder one of the contact elements comprises copper, nickel or alloys of the same.

15. A semiconductor device according to claim 9, wherein the underlying material is the contact area.

16. A semiconductor device according to claim 9, wherein the underlying material is the wiring component.

17. A semiconductor device, comprising:
a plurality of individual bonding leads each having a first end disposed on an individual contact area of a semiconductor chip and a second opposite end disposed on a wiring component of the semiconductor device,
wherein the bonding leads form a stack of at least a first contact element and a second arranged on top of the first contact element, a material of the first contact element comprises an ohmic contact transition with a material of the wiring component, a material of the second contact element comprises an ohmic contact transition with the material of the first contact element arranged there under, and the materials of the first and second contact elements comprise different material compositions.

18. A semiconductor device according to claim 17, wherein the different material compositions are metal alloys, a base metal of which is identical and alloying elements of which differ in such a way that one of the contact elements is harder than the other contact element.

19. A semiconductor device according to claim 17, wherein the different material compositions are aluminum alloys, a harder one of the contact elements comprising silicon as an alloying element.

20. A semiconductor device according to claim 17, wherein the different metal compositions are copper alloys, a harder one of the contact elements comprising Fe, Ni, P, Zn, Sn and/or Co as an alloying element.

21. A semiconductor device according to claim 17, wherein the different metal compositions comprise different base metals, which differ in their degrees of hardness in such a way that one of the contact elements is harder than the other contact element.

22. A semiconductor device according to claim 17, wherein one of the contact elements comprises aluminum, silver or gold or alloys of the same, and a harder one of the contact elements comprises copper, nickel or alloys of the same.

23. A semiconductor device according to claim 17 wherein the contact elements in the stack are of such a hardness that the hardness of the contact elements increases from the contact area toward the second contact element.

24. A semiconductor device according to claim 17, wherein the contact elements in the stack are of such a hardness that the hardness of the contact elements increases from the second contact element toward the contact area.

* * * * *